United States Patent
Handa et al.

(10) Patent No.: US 7,301,208 B2
(45) Date of Patent: Nov. 27, 2007

(54) SEMICONDUCTOR DEVICE AND METHOD FOR FABRICATING THE SAME

(75) Inventors: Takato Handa, Shiga (JP); Kazumi Kurimoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 50 days.

(21) Appl. No.: 11/118,389

(22) Filed: May 2, 2005

(65) Prior Publication Data

US 2006/0027865 A1 Feb. 9, 2006

(30) Foreign Application Priority Data

Aug. 4, 2004 (JP) ............................. 2004-227688

(51) Int. Cl.
 H01L 29/76 (2006.01)
 H01L 31/062 (2006.01)
 H01L 29/94 (2006.01)
(52) U.S. Cl. .................. 257/391; 257/404; 257/408
(58) Field of Classification Search ................ 257/336, 257/344, 404, 408, 391, E29.76, E29.94
 See application file for complete search history.

(56) References Cited

U.S. PATENT DOCUMENTS 6,524,903 B2 * 2/2003 Ootsuka et al. .............. 438/217

FOREIGN PATENT DOCUMENTS

JP 2002-198529 A 7/2002

\* cited by examiner

*Primary Examiner*—Theresa T Doan
(74) *Attorney, Agent, or Firm*—McDermott Will & Emery LLP

(57) ABSTRACT

A first doped layer of a conductivity type opposite to that of source/drain regions is formed in a semiconductor substrate under a gate electrode. A second doped layer of the conductivity type opposite to that of the source/drain regions is formed in the semiconductor substrate below the first doped layer. The first doped layer has a first peak in dopant concentration distribution in the depth direction. The first peak is located at a position shallower than the junction depth of the source/drain regions. The second doped layer has a second peak in dopant concentration distribution in the depth direction. The second peak is located at a position deeper than the first peak and shallower than the junction depth of the source/drain regions. The dopant concentration at the first peak is higher than that at the second peak.

16 Claims, 7 Drawing Sheets

US 7,301,208 B2

SEMICONDUCTOR DEVICE AND METHOD FOR FABRICATING THE SAME

CROSS-REFERENCE TO RELATED APPLICATION

The disclosure of Japanese Patent Application No. 2004-227688 filed on Aug. 4, 2004 including specification, drawings and claims is incorporated herein by reference in its entirety.

BACKGROUND OF THE INVENTION

The present invention relates to a technique for fabricating a semiconductor device, and particularly to a technique which is effective when applied to a semiconductor device including a metal insulator semiconductor field effect transistor (MISFET) of a generation of a gate length of 0.1 μm or less.

As a MISFET in which a short-channel effect is suppressed, a MISFET having two peaks in substrate dopant concentration distribution under a gate electrode is disclosed in, for example, Japanese Unexamined Patent Publication (Kokai) No. 2002-198529.

FIG. 8 is a cross-sectional view illustrating a conventional MISFET, specifically a conventional p-MISFET having a gate length of 0.1 μm or less. The conventional MISFET shown in FIG. 8 is formed by the following method.

First, an n-well 2 is formed in a semiconductor substrate 1. Then, a first n-type doped layer 9 is formed in a surface of the n-well 2. A second n-type doped layer 10 is formed in a portion of the n-well 2 below the first n-type doped layer 9. The distribution of dopant concentration of the first n-type doped layer 9 in the depth direction has a first peak. The distribution of dopant concentration of the second n-type doped layer 10 in the depth direction has a second peak.

Next, a gate electrode 4 is formed over the semiconductor substrate 1 with a gate insulating film 3 interposed therebetween. Then, p-type source/drain extension regions 7 are formed in the semiconductor substrate 1 at both sides of the gate electrode 4.

Thereafter, insulating sidewall spacers having a multilayer structure of a silicon oxide film 5 and a silicon nitride film 6 are formed on the sides of the gate electrode 4, and then p-type source/drain doped regions 8 are formed in the semiconductor substrate 1 at both sides of the gate electrode 4.

The first n-type doped layer 9 and the second n-type doped layer 10 are formed to depths shallower than the junction depth of the source/drain doped regions 8. The first peak in the dopant concentration distribution of the first n-type doped layer 9 in the depth direction is located at a position deeper than a region in which channel is to be formed (hereinafter, referred to as a channel region) in the semiconductor substrate 1. The dopant concentration at the second peak in the dopant concentration distribution of the second n-type doped layer 10 is higher than that at the first peak in the dopant concentration distribution of the first n-type doped layer 9.

In the conventional MISFET structure described above, i.e., a MISFET structure which has two peaks: a first peak in the dopant concentration distribution of the first n-type doped layer 9 and a second peak in the dopant concentration distribution of the second n-type doped layer 10 and in which the dopant concentration at the second peak is higher than that at the first peak, the controllable width of a depletion layer is large, so that it is possible to reduce the subthreshold coefficient. This prevents decrease of the threshold voltage and, thereby, increases the switching speed of the MISFET. The foregoing description has been given on a p-MISFET but is also applicable to n-MISFETs.

SUMMARY OF THE INVENTION

However, the conventional MISFET described above has a drawback in which power consumption of the semiconductor device is not reduced because of increased OFF leakage current in both cases of a p-MISFET and an n-MISFET.

It is therefore an object of the present invention to ensure reduction of power consumption in a MISFET, particularly a short-channel MISFET having a gate length of about 0.1 μm or less.

To achieve this object, the present inventors studied to find a cause of increase of OFF leakage current in the conventional MISFET which has two peaks, i.e., a first peak (at a shallow position) and a second peak (at a deep position), in the dopant concentration distributions of doped layers under a gate electrode and in which the dopant concentration at the second peak is higher than that at the first peak. As a result, the following findings were obtained.

To reduce power consumption of a semiconductor device, OFF leakage current generally needs to be reduced by increasing a substrate dopant concentration under a gate electrode. However, in the case of a p-MISFET, for example, in the conventional MISFET which exhibits two peaks, i.e., a first peak in the dopant concentration distribution of the first n-type doped layer 9 as an upper layer and a second peak in the dopant concentration distribution of the second n-type doped layer 10 as a lower layer, and in which the dopant concentration at the second peak is higher than that at the first peak, if the dopant concentration of the first n-type doped layer 9 having the first peak in the dopant concentration distribution is increased so as to reduce OFF leakage current, the dopant concentration of the second n-type doped layer 10 having the second peak in the dopant concentration distribution also needs to be increased because the dopant concentration at the second peak needs to be higher than that at the first peak. This causes the dopant concentration near the junction between the second n-type doped layer 10 and the p-type source/drain doped regions 8 to increase, so that a greater electric field is generated upon an application of an operation voltage. As a result, OFF leakage current increases, and power consumption of a semiconductor device is not reduced. The same holds true for n-MISFETs. The OFF leakage current herein is current flowing between source and drain upon an application of an operation voltage across the source and the drain and no application of a voltage to the gate electrode.

The present invention has been accomplished based on the foregoing findings. Specifically, a semiconductor device according to the present invention includes: a gate electrode formed on a semiconductor substrate; source/drain regions formed in the semiconductor substrate at both sides of the gate electrode; a first doped layer of a conductivity type opposite to that of the source/drain regions, the first doped layer being formed in the semiconductor substrate and located under the gate electrode; and a second doped layer of the conductivity type opposite to that of the source/drain regions, the second doped layer being formed in the semiconductor substrate and located below the first doped layer. The first doped layer has a first peak in dopant concentration distribution in a depth direction. The first peak is located at a position shallower than a junction depth of the source/ drain regions. The second doped layer has a second peak in dopant concentration distribution in a depth direction. The second peak is located at a position deeper than the first peak and shallower than the junction depth of the source/drain regions. A dopant concentration at the first peak is higher than that at the second peak. In this device, the first doped layer having the first peak in the dopant concentration distribution has a function of preventing punch-through between the extension regions and the second doped layer having the second peak in the dopant concentration distribution has a function of preventing punch-through between the source/drain regions.

In the semiconductor device of the present invention, the dopant concentration at the first peak in the dopant concentration distribution of the first doped layer formed in the semiconductor substrate under the gate electrode is higher than that at the second peak in the dopant concentration distribution of the second doped layer formed below the first doped layer, so that the following advantages are obtained. That is, even if the dopant concentration of the first doped layer having the first peak in the dopant concentration distribution is increased so as to reduce OFF leakage current, the dopant concentration of the second doped layer having the second peak in the dopant concentration distribution does not need to be increased because the dopant concentration at the second peak does not need to be higher than that at the first peak, unlike the conventional semiconductor device. Therefore, it is possible to keep the dopant concentration of the second doped layer low, so that the dopant concentration near the junction between the source/drain regions and the second doped layer of the conductivity type opposite to that of the source/drain regions is reduced, as compared to the conventional semiconductor device which has a threshold voltage approximately equal to that of the device of the present invention and in which the dopant concentration at the second peak is higher than that at the first peak. As a result, a smaller electric field is generated upon an application of an operation voltage, so that OFF leakage current decreases and, thereby, power consumption of the semiconductor device is reduced.

In the semiconductor device of the present invention, if the first peak is located at a position deeper than a region where channel is to be formed in the semiconductor substrate, the foregoing advantages are ensured.

A first method for fabricating a semiconductor device according to the present invention includes the steps of: (a) forming a first doped layer of a first conductivity type in a surface portion of a semiconductor substrate; (b) forming a gate electrode on the semiconductor substrate, after the step (a) has been performed; (c) introducing a dopant of a second conductivity type in the semiconductor substrate using the gate electrode as a mask, thereby forming an extension region; (d) introducing a dopant of the first conductivity type in the semiconductor substrate using the gate electrode as a mask, thereby forming a second doped layer below the extension region and the first doped layer in the semiconductor substrate, after the step (c) has been performed; (e) forming an insulating sidewall on a side of the gate electrode, after the step (d) has been performed, and (f) introducing a dopant of the second conductivity in the semiconductor substrate using the gate electrode and the insulating sidewall as masks, thereby forming source/drain regions. The first doped layer has a first peak in dopant concentration distribution in a depth direction. The first peak is located at a position shallower than a junction depth of the source/drain regions. The second doped layer has a second peak in dopant concentration distribution in a depth direction. The second peak is located at a position deeper than the first peak and shallower than the junction depth of the source/drain regions. A dopant concentration at the first peak is higher than that at the second peak.

A second method for fabricating a semiconductor device according to the present invention includes the steps of: (a) forming a first doped layer of a first conductivity type in a surface portion of a semiconductor substrate and forming a second doped layer in a portion of the semiconductor substrate below the first doped layer; (b) forming a gate electrode on the semiconductor substrate, after the step (a) has been performed; (c) introducing a dopant of a second conductivity type in the semiconductor substrate using the gate electrode as a mask, thereby forming an extension region; (d) forming an insulating sidewall on a side of the gate electrode, after the step (c) has been performed, and (e) introducing a dopant of the second conductivity in the semiconductor substrate using the gate electrode and the insulating sidewall as masks, thereby forming source/drain regions. The first doped layer has a first peak in dopant concentration distribution in a depth direction. The first peak is located at a position shallower than a junction depth of the source/drain regions. The second doped layer has a second peak in dopant concentration distribution in a depth direction. The second peak is located at a position deeper than the first peak and shallower than the junction depth of the source/drain regions. A dopant concentration at the first peak is higher than that at the second peak. In the second method, the second doped layer may be formed after the first doped layer has been formed or before the first doped layer is formed.

That is, both of the first and second methods are used to fabricate the semiconductor device of the present invention described above, and the advantages as those of the semiconductor device of the present invention are obtained.

As described above, the present invention relates to a technique for fabricating a semiconductor device, and particularly to a technique which is effective when applied to a semiconductor device including a MISFET of a generation of a gate length of 0.1 µm or less. This technique ensures reduction of power consumption of the semiconductor device by reducing OFF leakage current.

DESCRIPTION OF THE PREFERRED EMBODIMENTS

Embodiment 1

Hereinafter, a semiconductor device and a method for fabricating the device according to a first embodiment of the present invention will be described with reference to drawings.

Figure 1:
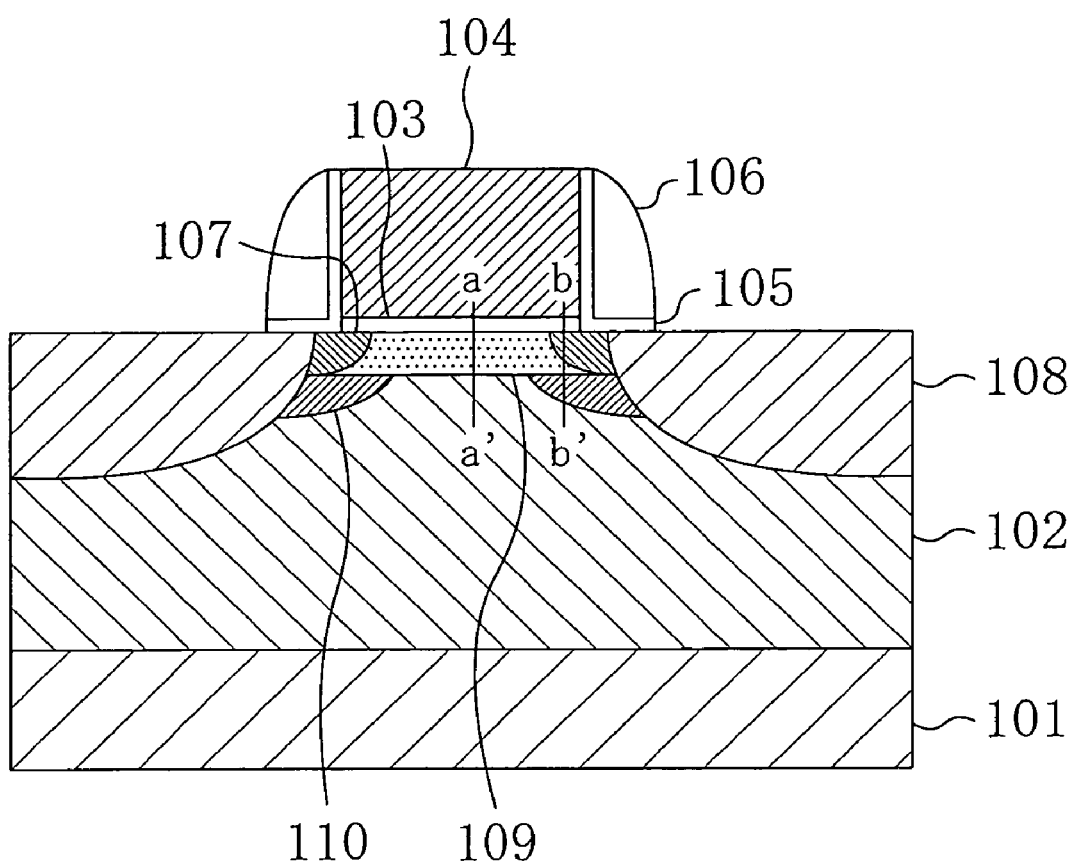
FIG. 1 is a cross-sectional view illustrating a semiconductor device according to a first embodiment of the present invention.

FIG. 1 is a cross-sectional view illustrating a semiconductor device according to the first embodiment, specifically a p-channel metal oxide semiconductor (p-MOS) device having a gate length of 0.1 μm or less.

As shown in FIG. 1, an n-well 102 is formed in a p-MISFET region (i.e., a region for forming a p-MISFET) of a substrate 101 made of, for example, p-type single crystalline silicon. A gate electrode 104 made of, for example, a p-type polycrystalline silicon film is formed over the p-MISFET region of the substrate 101 with a gate insulating film 103 interposed therebetween. Insulating sidewall spacers having a multilayer structure of; for example, a silicon oxide film 105 and a silicon nitride film 106 are formed on the sides of the gate electrode 104. P-type source/drain extension regions 107 are formed in a surface portion of the well 102 below the respective sides of the gate electrode 104. Source/drain doped regions 108 having a junction depth (e.g., about 0.11 μm from the substrate surface) greater than the junction depth (e.g., about 0.04 μm from the substrate surface) of the extension regions 107 are formed in the well 102 at the outside of the extension regions 107 when viewed from the gate electrode 104. A first doped layer 109 of, for example, n-type is formed in a surface portion of the well 102 under the gate electrode 104 and is sandwiched between the extension regions 107. An n-type second doped layer 110 to be pocket regions is formed in portions of the well 102 below the extension regions 107 and the first doped layer 109 and is in contact with the source/drain doped regions 108. In this embodiment, each of the first doped layer 109 and the second doped layer 110 is formed to a depth shallower than the junction depth of the source/drain doped regions 108.

Figure 2A:
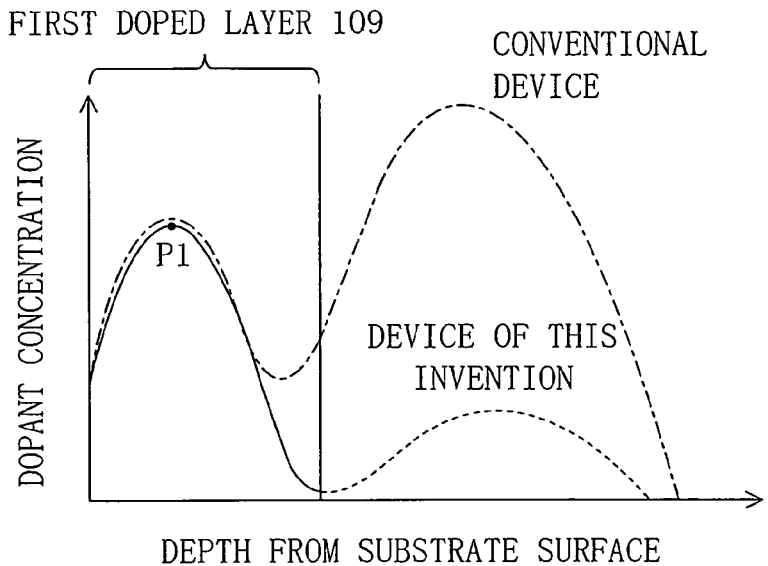
FIG. 2A is a graph showing a dopant concentration distribution along the a-a' line in FIG. 1.
Figure 2B:
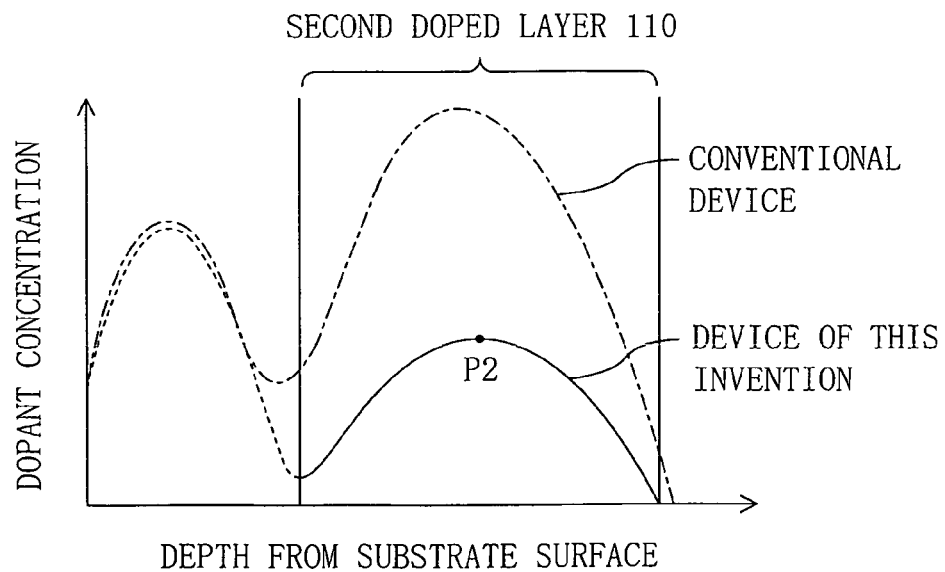
FIG. 2B is a graph showing a dopant concentration distribution along the b-b' line in FIG. 1.

Now, characteristics of the p-MISFET of this embodiment shown in FIG. 1 will be described with reference to FIGS. 2A and 2B. FIG. 2A shows a dopant concentration distribution along the a-a' line in FIG. 1. FIG. 2B shows a dopant concentration distribution along the b-b' line in FIG. 1. FIGS. 2A and 2B also show dopant concentration distributions of a conventional p-MISFET for comparison.

As shown in FIG. 2A, the first doped layer 109 has a first peak P1 (at which the dopant (impurity) concentration is equal to or higher than $5 \times 10^{18}$ (ions/cm³) and equal to or less than $8 \times 10^{18}$ (ions/cm³), for example) in the dopant concentration distribution in the depth direction. In this case, the first peak P1 is located at a depth between 5 nm and 15 nm, both inclusive, from the substrate surface. That is, the first peak P1 is located at a position deeper than a channel region (i.e., a region defined to a depth of, for example, about 2 nm or less from the substrate surface) and shallower than the junction depth (e.g., about 0.1 μm from the substrate surface) of the source/drain doped regions 108 in the substrate 101.

As shown in FIG. 2B, the second doped layer 110 has a second peak P2 (at which the dopant (impurity) concentration is equal to or higher than $1 \times 10^{18}$ (ions/cm³) and less than $5 \times 10^{18}$ (ions/cm³), for example) in the dopant concentration distribution in the depth direction. In this case, the second peak P2 is located at a depth between 20 nm and 90 nm, both inclusive, from the substrate surface. That is, the second peak P2 is located at a position deeper than the first peak P1 and shallower than the junction depth (e.g., about 0.1 μm from the substrate surface) of the source/drain doped regions 108.

As shown in FIGS. 2A and 2B, the dopant concentration at the first peak P1 is higher than that at the second peak P2 in the p-MISFET of this embodiment whereas the dopant concentration at a peak at a shallow position (corresponding to the first peak P1 in this embodiment) is lower than that at a peak at a deep position (corresponding to the second peak P2 in this embodiment) in the conventional p-MISFET.

In the semiconductor device of this embodiment having the foregoing characteristics, unlike the conventional semiconductor device, the dopant concentration at the first peak P1 in the dopant concentration distribution of the first doped layer 109 formed in the substrate 101 under the gate electrode 104 is higher than that at the second peak P2 in the dopant concentration distribution of the second doped layer 110 formed below the first doped layer 109. Accordingly, even if the dopant concentration of the first doped layer 109 is increased so as to reduce OFF leakage current, the dopant concentration of the second doped layer 110 does not need to be increased because the dopant concentration at the second peak P2 does not need to be higher than that at the first peak P1, unlike the conventional semiconductor device. Therefore, it is possible to keep the dopant concentration of the second doped layer 110 low, so that the dopant concentration near the junction between the source/drain doped regions 108 and the second doped layer 110 of a conductivity type opposite to that of the source/drain doped regions 108 is reduced as compared to the conventional semiconductor device which has a threshold voltage approximately equal to that of the device of this embodiment and in which the dopant concentration at the second peak is higher than that at the first peak. As a result, a smaller electric field is generated upon an application of an operation voltage, so that OFF leakage current decreases and, thereby, power consumption of the semiconductor device is reduced.

Figure 3:
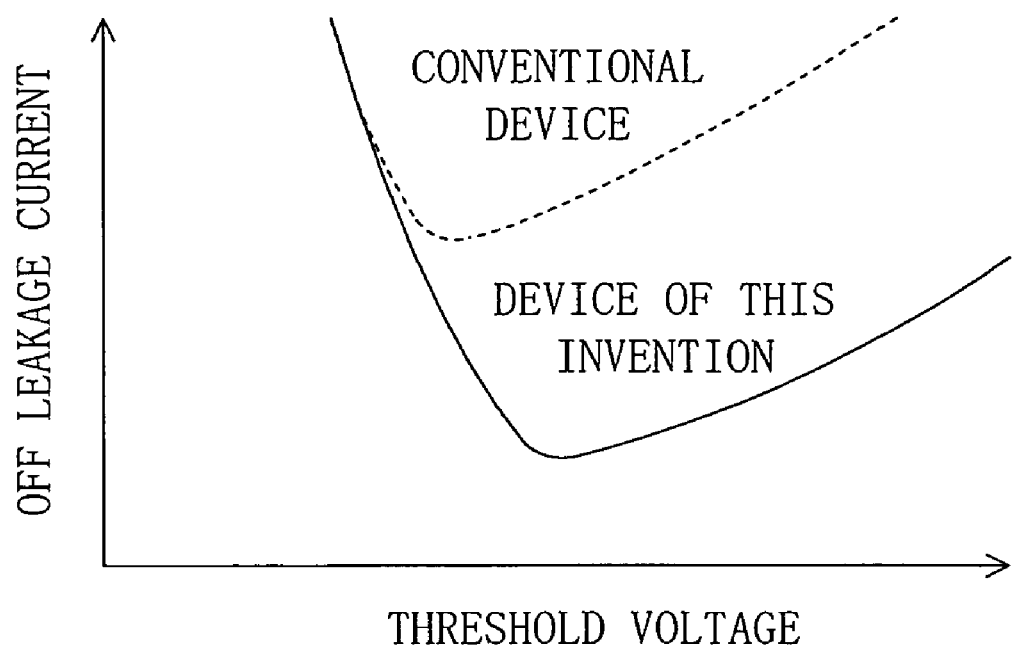
FIG. 3 shows a relationship between OFF leakage current and a threshold voltage in the semiconductor device of the first embodiment.

FIG. 3 shows a relationship between OFF leakage current and a threshold voltage in the p-MISFET of this embodiment in comparison with a relationship between OFF leakage current and a threshold voltage in the conventional p-MISFET.

As shown in FIG. 3, power consumption of the semiconductor device is reduced by decreasing OFF leakage current in this embodiment, as compared to the conventional semiconductor device.

Hereinafter, a method for fabricating the p-MISFET of this embodiment shown in FIG. 1 will be described with reference to drawings.

FIGS. 4A through 4F are cross-sectional views illustrating respective process steps of the method for fabricating the semiconductor device according to the first embodiment.

Figure 4A:
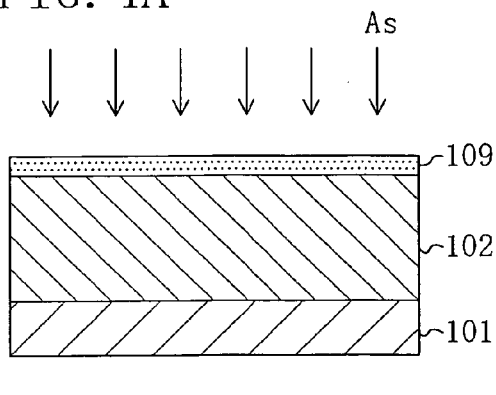
FIGS. 4A through 4F are cross-sectional views illustrating respective process steps of a method for fabricating the semiconductor device according to the first embodiment.

First, as shown in FIG. 4A, a substrate 101 made of, for example, p-type single crystalline silicon is prepared and ions of an n-type dopant, e.g., phosphorus (P), are implanted in a p-MISFET region of the substrate 101 a plurality of times at different implantation energies so as to form a well 102 of, for example, n-type. These P ion implantations are performed at implantation energies of, for example, 500 keV and 200 keV and at a dose of, for example, $1 \times 10^{13}$ cm⁻² (constant).

Subsequently, ions of an n-type dopant, e.g., arsenic (As), are implanted in the p-MISFET region of the substrate 101, thereby forming a first doped layer 109 of, for example, n-type having a first peak P1 in its dopant concentration distribution in the depth direction. This As ion implantation is performed at an implantation energy of, for example, 50 eV and at a dose of, for example, $5 \times 10^{12}$ cm$^{-2}$. The first doped layer 109 has a function of preventing punch-through between source/drain extension regions 107 (see FIG. 4C). The first peak P1 is located at a depth between 5 nm to 15 nm, both inclusive, for example, from the substrate surface. The dopant concentration at the first peak P1 is in the range from $5 \times 10^{18}$ (ions/cm$^3$) to $8 \times 10^{18}$ (ions/cm$^3$), both inclusive, for example.

Figure 4D:
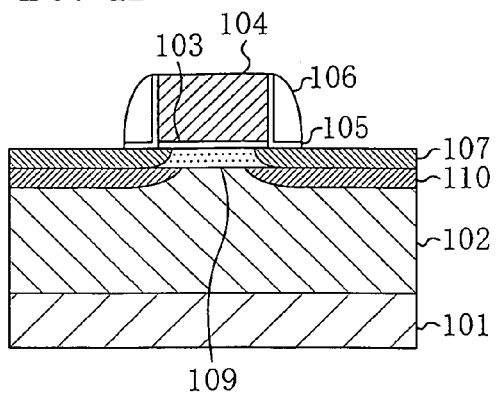
Figure 4B:
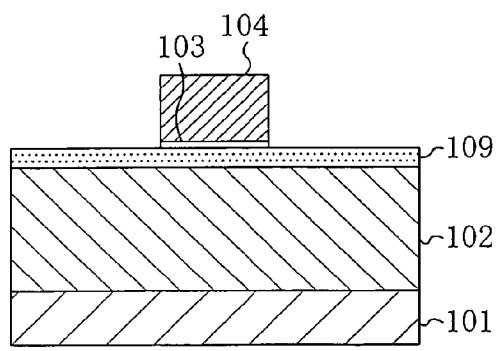

Next, as shown in FIG. 4B, thermal oxidation is performed on the substrate 101 so that a gate insulating film 103 with a thickness of, for example, about 2 nm is formed on the surface of the substrate 101. Then, a p-type polycrystalline silicon film is deposited by, for example, a chemical vapor deposition (CVD) process to a thickness of, for example, about 200 nm over the substrate 101. Thereafter, the polycrystalline silicon film is etched using a resist pattern (not shown) covering a gate electrode region as a mask, thereby forming a gate electrode 104 over the p-MISFET region of the substrate 101 with the gate insulating film 103 interposed therebetween. The gate electrode 104 is formed out of the p-type polycrystalline silicon film and has a gate length of about 0.1 μm.

Figure 4E:
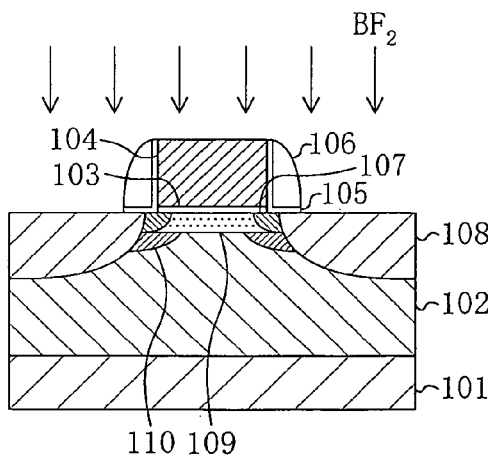
Figure 4C:
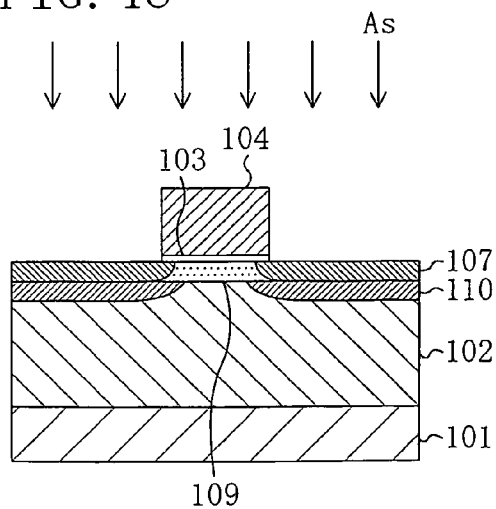

Then, as shown in FIG. 4C, ions of a p-type dopant, e.g., boron fluoride (BF$_2$), are implanted in the n-well 102 using the gate electrode 104 for a p-MISFET as a mask, thereby forming source/drain extension regions 107 for the p-MISFET. This BF$_2$ ion implantation is performed at an implantation energy of, for example, 3 keV and at a dose of, for example, $1 \times 10^{15}$ cm$^{-2}$. The extension regions 107 have a junction depth of about 0.04 μm, for example.

Subsequently, ions of an n-type dopant, e.g., arsenic (As), are implanted in the n-well 102 at an angle of, for example, about 10° to 25° with respect to the normal direction to the substrate surface using the gate electrode 104 for the p-MISFET as a mask, thereby forming a second doped layer 110 to be pocket regions for the p-MISFET in portions of the n-well 102 below the extension regions 107 and the first doped layer 109. This As ion implantation is performed at an implantation energy of, for example, 80 keV and at a dose of, for example, $1 \times 10^{13}$ cm$^{-2}$. The second doped layer 110 has a function of preventing punch-through between source/drain doped regions 108 (see FIG. 4E). The second peak P2 is located at a depth between 20 nm and 90 nm, both inclusive, for example, from the substrate surface. The dopant concentration at the second peak P2 is equal to or higher than $1 \times 10^{18}$ (ions/cm$^3$) and less than $5 \times 10^{18}$ (ions/cm$^3$), for example. That is, the depth of the second peak P2 of the second doped layer 110 from the surface of the substrate 101 is greater than that of the first peak P1 of the first n-type doped layer 109 from the surface of the substrate 101. The dopant concentration at the second peak P2 of the second doped layer 110 is lower than that at the first peak P1 of the first n-type doped layer 109. In this embodiment, the junction depth of the extension regions 107 is approximately equal to the depth of the interface between the first n-type doped layer 109 and the second doped layer 110.

Then, as shown in FIG. 4D, a silicon oxide film 105 and a silicon nitride film 106 are deposited in this order over the substrate 101 by CVD processes. Subsequently, anisotropic etching is performed on the silicon nitride film 106 by, for example, a reactive ion etching (RIE) process. Thereafter, etching is performed on the silicon oxide film 105. In this manner, sidewall spacers are formed out of the silicon oxide film 105 and the silicon nitride film 106 on the sides of the gate electrode 104 for the p-MISFET.

Subsequently, as shown in FIG. 4E, ions of a p-type dopant, e.g., BF$_2$, are implanted in the n-well 102 using the gate electrode 104 for the p-MISFET and the sidewall spacers (i.e., the silicon oxide film 105 and the silicon nitride film 106) as masks, thereby forming source/drain doped regions 108 having a junction depth deeper than the second peak P2 of the second doped layer 110. This BF$_2$ ion implantation is performed at an implantation energy of, for example, 25 keV and at a dose of, for example, $2 \times 10^{15}$ cm$^{-2}$. The junction depth of the source/drain doped regions 108 is about 0.1 μm, for example.

Figure 4F:
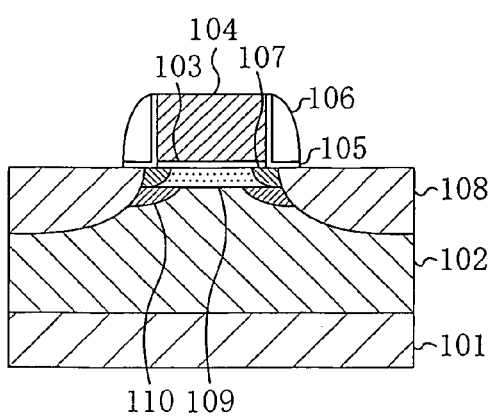

Through the foregoing process steps, a p-MISFET is formed as shown in FIG. 4F.

In the first embodiment, the p-MISFET has been described as an example. However, the same holds true for n-MISFETs.

In the first embodiment, the first peak P1 in the dopant concentration distribution of the first doped layer 109 in the depth direction is preferably located at a position deeper than a channel region of the substrate 101. This ensures the reduction of power consumption of the semiconductor device obtained by reducing OFF leakage current described above.

If the semiconductor device of the first embodiment is a MISFET having a gate length of about 0.1 μm or less, i.e., a short-channel MISFET, power consumption is more greatly reduced as compared to conventional techniques.

Embodiment 2

Hereinafter, a semiconductor device and a method for fabricating the device according to a second embodiment of the present invention will be described with reference to drawings.

Figure 5:
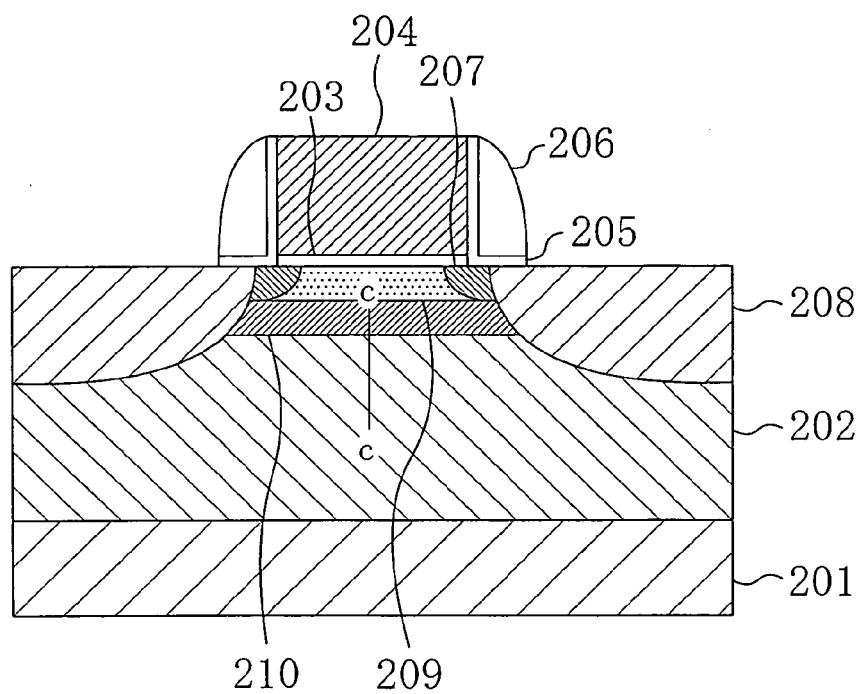
FIG. 5 is a cross-sectional view illustrating a semiconductor device according to a second embodiment of the present invention.

FIG. 5 is a cross-sectional view illustrating a semiconductor device according to the second embodiment, specifically a p-MOS device having a gate length of 0.1 μm or less.

As shown in FIG. 5, a well 202 of, for example, n-type is formed in a p-MISFET region of a substrate 201 made of, for example, p-type single crystalline silicon. A gate electrode 204 made of, for example, a p-type polycrystalline silicon film is formed over the p-MISFET region of the substrate 201 with a gate insulating film 203 interposed therebetween. Insulating sidewall spacers having a multilayer structure of, for example, a silicon oxide film 205 and a silicon nitride film 206 are formed on the sides of the gate electrode 204. Source/drain extension regions 207 of, for example, p-type are formed in a surface portion of the well 202 below the respective sides of the gate electrode 204. Source/drain doped regions 208 having a junction depth (e.g., about 0.1 μm from the substrate surface) greater than the junction depth (e.g., about 0.04 μm from the substrate surface) of the extension regions 207 are formed in the well 202 at the outside of the extension regions 207 when viewed from the gate electrode 204. A first doped layer 209 of, for example, n-type is formed in a surface portion of the well 202 below the gate electrode 204 and is sandwiched between the extension regions 207. A second doped layer 210 of, for example, n-type is formed in a portion of the well 202 under the extension regions 207 and the first doped layer 209 and is sandwiched between the source/drain doped regions 208.

In this embodiment, each of the first doped layer 209 and the second doped layer 210 is formed to a depth shallower than the junction depth of the source/drain doped regions 208.

Figure 6:
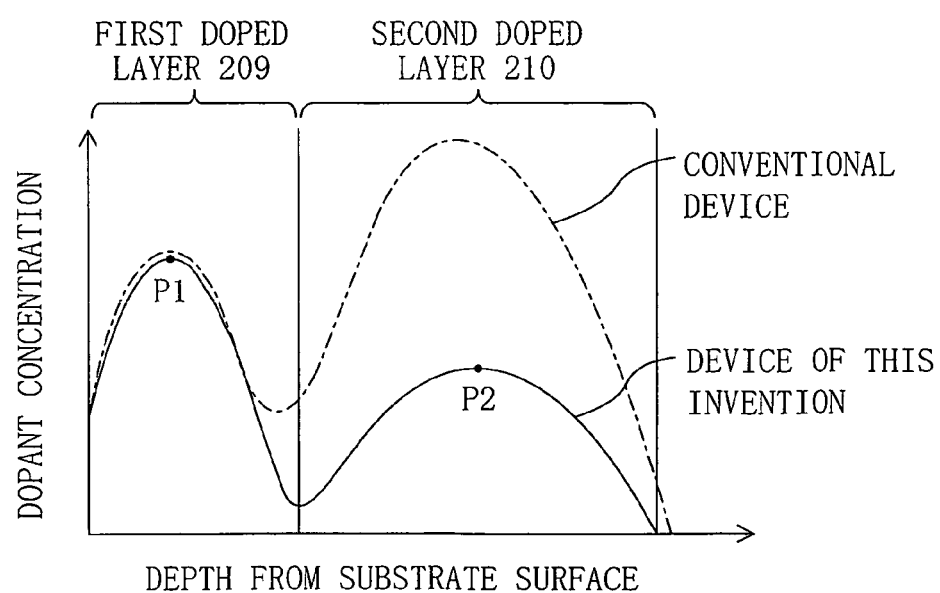
FIG. 6 is a graph showing a dopant concentration distribution along the c-c' line in FIG. 5.

Now, characteristics of the p-MISFET of this embodiment shown in FIG. 5 will be described with reference to FIG. 6. FIG. 6 shows a dopant concentration distribution along the c-c' line in FIG. 5. In FIG. 6, a dopant concentration distribution of a conventional p-MISFET is also shown for comparison.

As shown in FIG. 6, the first doped layer 209 has a first peak P1 (at which the dopant (impurity) concentration is equal to or higher than $5 \times 10^{18}$ (ions/cm$^3$) and equal to or less than $8 \times 10^{18}$ (ions/cm$^3$), for example) in the dopant concentration distribution in the depth direction. In this case, the first peak P1 is located at a depth between 5 nm and 15 nm, both inclusive, from the substrate surface. That is, the first peak P1 is located at a position deeper than a channel region (i.e., a region defined to a depth of, for example, about 2 nm or less from the substrate surface) and shallower than the junction depth (e.g., about 0.1 μm from the substrate surface) of the source/drain doped regions 208 in the substrate 201.

As shown in FIG. 6, the second doped layer 210 has a second peak P2 (at which the dopant (impurity) concentration is equal to or higher than $1 \times 10^{18}$ (ions/cm$^3$) and less than $5 \times 10^{18}$ (ions/cm$^3$), for example) in the dopant concentration distribution in the depth direction. In this case, the second peak P2 is located at a depth between 20 nm and 90 nm, both inclusive, from the substrate surface. That is, the second peak P2 is located at a position deeper than the first peak P1 and shallower than the junction depth (e.g., about 0.1 μm from the substrate surface) of the source/drain doped regions 208.

As shown in FIG. 6, the dopant concentration at the first peak P1 is higher than that at the second peak P2 in the p-MISFET of this embodiment whereas the dopant concentration at a peak at a shallow position (corresponding to the first peak P1 in this embodiment) is lower than that at a peak at a deep position (corresponding to the second peak P2 in this embodiment) in the conventional p-MISFET.

In the semiconductor device of this embodiment having the foregoing characteristics, the dopant concentration at the first peak P1 in the dopant concentration distribution of the first doped layer 209 formed in the substrate 201 under the gate electrode 204 is higher than that at the second peak P2 in the dopant concentration distribution of the second doped layer 210 formed below the first doped layer 209, unlike the conventional semiconductor device. Accordingly, even if the dopant concentration of the first doped layer 209 is increased so as to reduce OFF leakage current, the dopant concentration of the second doped layer 210 does not need to be increased because the dopant concentration at the second peak P2 does not need to be higher than that at the first peak P1, unlike the conventional semiconductor device. Therefore, it is possible to keep the dopant concentration of the second doped layer 210 low, so that the dopant concentration near the junction between the source/drain regions 208 and the second doped layer 210 of a conductivity type opposite to that of the source/drain regions 208 is reduced as compared to the conventional semiconductor device which has a threshold voltage approximately equal to that of the device of this embodiment and in which the dopant concentration at the second peak is higher than that at the first peak. As a result, a smaller electric field is generated upon an application of an operation voltage, so that OFF leakage current decreases and, thereby, power consumption of the semiconductor device is reduced.

Hereinafter, a method for fabricating the p-MISFET of this embodiment shown in FIG. 5 will be described with reference to drawings.

FIGS. 7A through 7F are cross-sectional views illustrating respective process steps of the method for fabricating the semiconductor device according to the second embodiment.

Figure 7A:
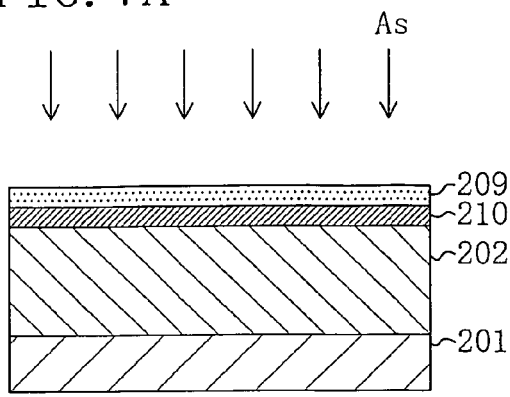
FIGS. 7A through 7F are cross-sectional views illustrating respective process steps of a method for fabricating the semiconductor device according to the second embodiment.

First, as shown in FIG. 7A, a substrate 201 made of, for example, p-type single crystalline silicon is prepared and ions of an n-type dopant, e.g., phosphorus (P), are implanted in a p-MISFET region of the substrate 201 a plurality of times at different implantation energies so as to form a well 202 of, for example, n-type. These P ion implantations are performed at implantation energies of, for example, 500 keV and 200 keV and at a dose of, for example, $1 \times 10^{13}$ cm$^{-2}$ (constant).

Subsequently, ions of an n-type dopant, e.g., arsenic (As), are implanted in the p-MISFET region of the substrate 201, thereby forming a first doped layer 209 of, for example, n-type having a first peak P1 in its dopant concentration distribution in the depth direction. This As ion implantation is performed at an implantation energy of, for example, 50 eV and at a dose of, for example, $5 \times 10^{12}$ cm$^{-2}$. The first doped layer 209 has a function of preventing punch-through between source/drain extension regions 207 (see FIG. 7C). The first peak P1 is located at a depth between 5 nm to 15 nm, both inclusive, for example, from the substrate surface. The dopant concentration at the first peak P1 is in the range from $5 \times 10^{18}$ (ions/cm$^3$) to $8 \times 10^{18}$ (ions/cm$^3$), both inclusive, for example.

Thereafter, ions of an n-type dopant, e.g., arsenic (As), are implanted in the n-well 202, thereby forming a second doped layer 210 in a portion of the n-well 202 below the first doped layer 209. This As ion implantation is performed at an implantation energy of, for example, 80 keV and at a dose of, for example, $1 \times 10^{13}$ cm$^{-2}$. The second doped layer 210 has a function of preventing punch-through between source/drain doped regions 208 (see FIG. 7E). The second peak P2 is located at a depth between 20 nm and 90 nm, both inclusive, for example, from the substrate surface. The dopant concentration at the second peak P2 is equal to or higher than $1 \times 10^{18}$ (ions/cm$^3$) and less than $5 \times 10^{18}$ (ions/cm$^3$), for example. That is, the depth of the second peak P2 of the second doped layer 210 from the surface of the substrate 201 is greater than that of the first peak P1 of the first n-type doped layer 209 from the surface of the substrate 201. The dopant concentration at the peak P2 of the second doped layer 210 is lower than that at the first peak P1 of the first n-type doped layer 209.

In this embodiment, the second doped layer 210 may be formed before the first doped layer 209 is formed.

Figure 7D:
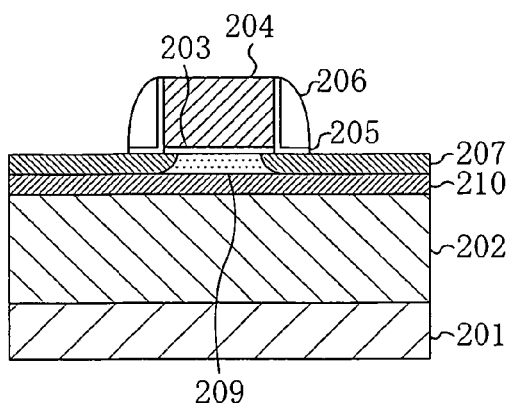
Figure 7B:
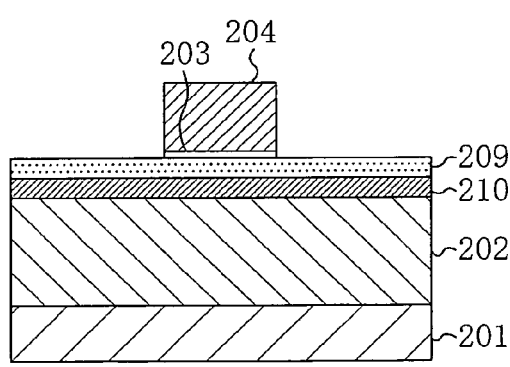

Then, as shown in FIG. 7B, thermal oxidation is performed on the substrate 201 so that a gate insulating film 203 with a thickness of, for example, about 2 nm is formed on the surface of the substrate 201. Then, a p-type polycrystalline silicon film is deposited by, for example, a CVD process to a thickness of, for example, about 200 nm over the substrate 201. Thereafter, the polycrystalline silicon film is etched using a resist pattern (not shown) covering a gate electrode region as a mask, thereby forming a gate electrode 204 over the p-MISFET region of the substrate 201 with the gate insulating film 203 interposed therebetween. The gate electrode 204 is formed out of the p-type polycrystalline silicon film and has a gate length of about 0.1 μm.

Figure 7E:
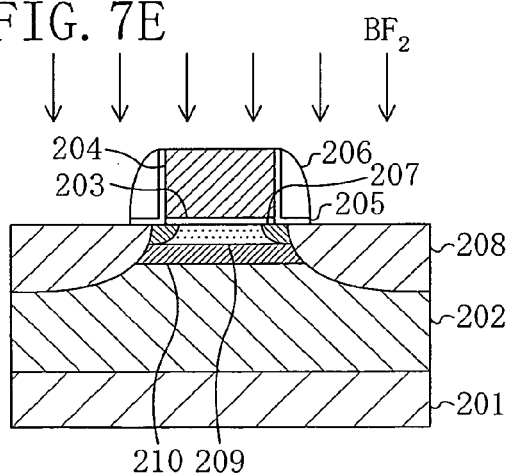
Figure 7C:
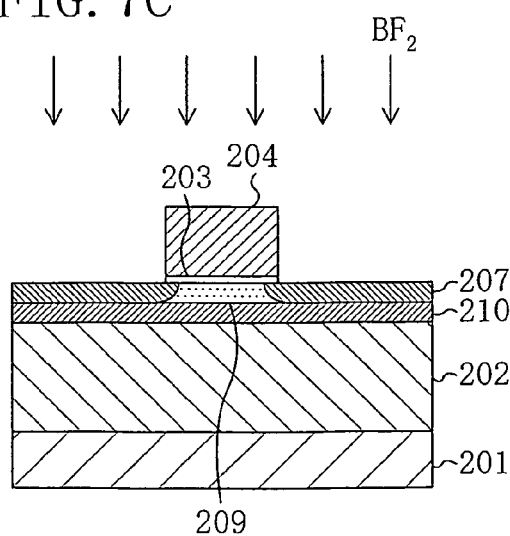

Then, as shown in FIG. 7C, ions of a p-type dopant, e.g., boron fluoride (BF$_2$), are implanted in the n-well 202 using the gate electrode 204 for a p-MISFET as a mask, thereby forming source/drain extension regions 207 for the p-MIS- FET. This BF$_2$ ion implantation is performed at an implantation energy of, for example, 3 keV and at a dose of, for example, 1×10$^{15}$ cm$^{-2}$. The extension regions 207 have a junction depth of about 0.04 μm, for example. In this embodiment, the junction depth of the extension regions 207 is approximately equal to the depth of the interface between the first n-type doped layer 209 and the second doped layer 210.

Then, as shown in FIG. 7D, a silicon oxide film 205 and a silicon nitride film 206 are deposited in this order over the substrate 201 by CVD processes. Subsequently, anisotropic etching is performed on the silicon nitride film 206 by, for example, an RIE process. Thereafter, etching is performed on the silicon oxide film 205. In this manner, sidewall spacers are formed out of the silicon oxide film 205 and the silicon nitride film 206 on the sides of the gate electrode 204 for the p-MISFET.

Subsequently, as shown in FIG. 7E, ions of a p-type dopant, e.g., BF$_2$, are implanted in the n-well 202 using the gate electrode 204 for the p-MISFET and the sidewall spacers (i.e., the silicon oxide film 205 and the silicon nitride film 206) as masks, thereby forming source/drain doped regions 208 having a junction depth deeper than the second peak P2 of the second doped layer 210. This BF$_2$ ion implantation is performed at an implantation energy of, for example, 25 keV and at a dose of, for example, 2×10$^{15}$ cm$^{-2}$. The junction depth of the source/drain doped regions 208 is about 0.1 μm, for example.

Figure 7F:
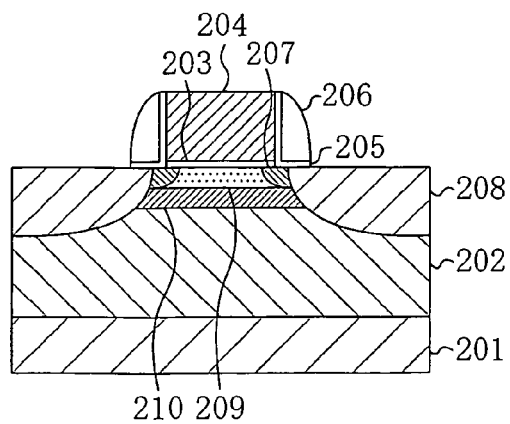
Figure 8:
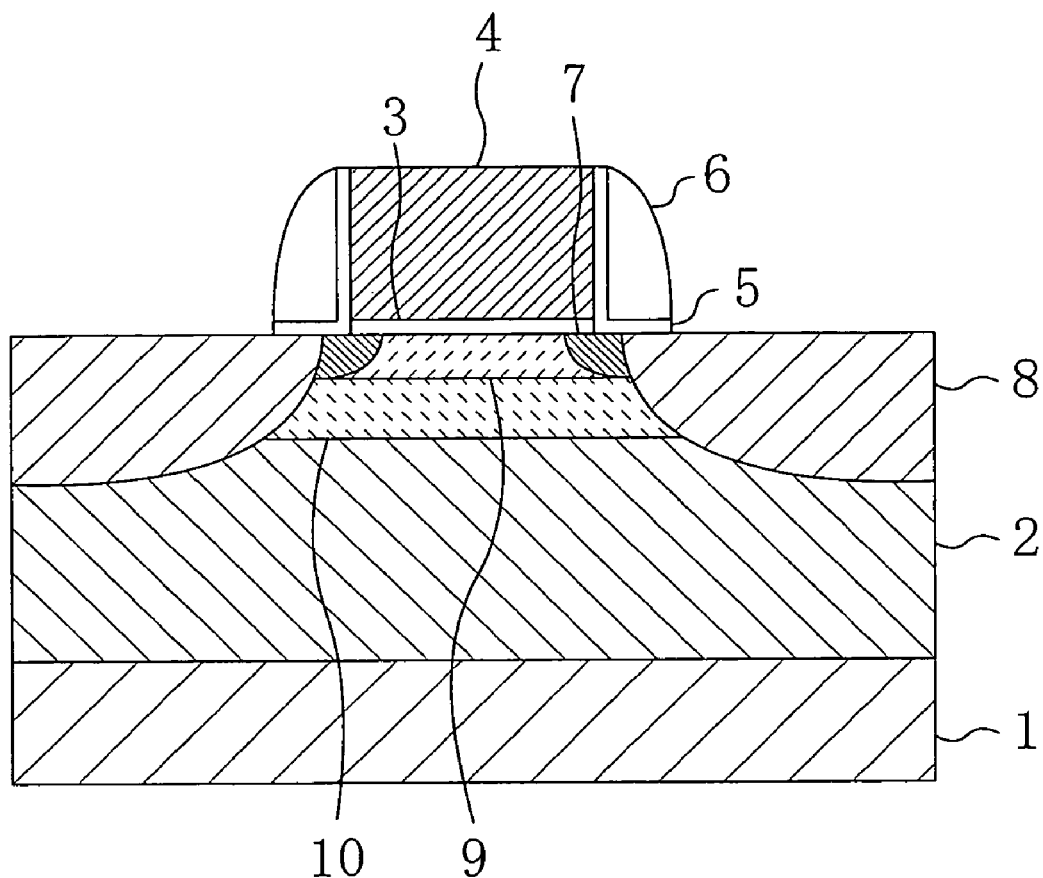
FIG. 8 is a cross-sectional view illustrating a conventional semiconductor device.

Through the foregoing process steps, a p-MISFET is formed as shown in FIG. 7F.

In the second embodiment, the p-MISFET has been described as an example. However, the same holds true for n-MISFETs.

In the second embodiment, the first peak P1 in the dopant concentration distribution of the first doped layer 209 in the depth direction is preferably located at a position deeper than a channel region of the substrate 201. This ensures the reduction of power consumption of the semiconductor device obtained by reducing OFF leakage current described above.

If the semiconductor device of the second embodiment is a MISFET having a gate length of about 0.1 μm or less, i.e., a short-channel MISFET, power consumption is more greatly reduced as compared to conventional techniques.

What is claimed is:

1. A semiconductor device, comprising:
    a gate electrode formed on a semiconductor substrate;
    source/drain regions of a first conductivity type formed in the semiconductor substrate at both sides of the gate electrode;
    a first doped layer of a second conductivity type opposite to that of the source/drain regions, the first doped layer being formed in the semiconductor substrate and located under the gate electrode; and
    a second doped layer of the second conductivity type opposite to that of the source/drain regions, the second doped layer being formed in the semiconductor substrate and located below the first doped layer,
    wherein the first doped layer has a first peak in dopant concentration distribution in a depth direction,
    the first peak is located at a position shallower than a junction depth of the source/drain regions,
    the second doped layer has a second peak in dopant concentration distribution in a depth direction,
    the second peak is located at a position deeper than the first peak and shallower than the junction depth of the source/drain regions, and
    a dopant concentration at the first peak is higher than that at the second peak, wherein the dopant concentration at the first peak of the first doped layer is equal to or higher than 5×10$^{18}$ ions/cm$^3$ and equal to or less than 8×10$^{18}$ ions/cm$^3$, and the dopant concentration at the second peak of the second doped layer is equal to or higher than 1×10$^{18}$ ions/cm$^3$ and less than 5×10$^{18}$ ions/cm$^3$.

2. The device of claim 1, wherein the first peak is located at a position deeper than a region where channel is to be formed in the semiconductor substrate.

3. The device of claim 1, further comprising a well of the second conductivity type formed under the source/drain regions in the semiconductor substrate.

4. The device of claim 1, wherein the second doped layer is entirely formed in the lower portion of the gate electrode in the semiconductor substrate.

5. The device of claim 1, further comprising:
    an insulating sidewall formed on a side of the gate electrode; and
    an extension region of the first conductivity type formed below the side of the gate electrode in the semiconductor substrate.

6. The device of claim 5, wherein the source/drain regions are formed at the outside of each of the extension region when viewed from the gate electrode and have a junction depth greater than the junction depth of the extension region.

7. The device of claim 5, wherein the first doped layer is formed so as to be sandwiched between the extension regions.

8. The device of claim 5, wherein the insulating sidewall has a multilayer structure of a silicon oxide film and a silicon nitride film.

9. The device of claim 5, wherein the insulating sidewall has a multilayer structure of a silicon oxide film having an L-shape and formed on the side of the gate electrode and a silicon nitride film formed on the silicon oxide film.

10. The device of claim 5, wherein the junction depth of the extension region is approximately equal to the depth of the interface between the first doped layer and the second doped layer.

11. The device of claim 1, wherein
    the first peak of the first doped layer is located at a depth between 5 nm and 15 nm, both inclusive, from the substrate surface, and
    the second peak of the second doped layer is located at a depth between 20 nm and 90 nm, both inclusive, from the substrate surface.

12. The device of claim 1, wherein the gate electrode has a gate length of 0.1 μm or less.

13. The device of claim 1, wherein
    the first conductivity type is a p-type, and
    the second conductivity type is a n-type.

14. The device of claim 1, wherein
    the first conductivity type is a n-type, and
    the second conductivity type is a p-type.

15. The device of claim 1, wherein the second doped layer is located at a position shallower than the junction depth of the source/drain regions.

16. The device of claim 1, wherein
    the first peak of the first doped layer is located at a position deeper than a channel region in the semiconductor substrate.

* * * * *